US006403465B1

(12) United States Patent
Liu et al.

(10) Patent No.: US 6,403,465 B1
(45) Date of Patent: Jun. 11, 2002

(54) METHOD TO IMPROVE COPPER BARRIER PROPERTIES

(75) Inventors: Chung-Shi Liu; Chen-Hua Yu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/473,033

(22) Filed: Dec. 28, 1999

(51) Int. Cl.⁷ .......................................... H01L 21/4763
(52) U.S. Cl. ..................... 438/627; 438/628; 438/629; 438/633; 438/637; 438/643; 438/644; 438/645; 438/648; 438/653; 438/654; 438/656; 438/672; 438/675; 438/680; 438/685; 438/687
(58) Field of Search ................................. 438/627–629, 438/631, 633, 637–638, 643–645, 648, 653–654, 656, 672, 675, 680, 685, 687

(56) References Cited

U.S. PATENT DOCUMENTS

| 5,714,418 A | 2/1998 | Bai et al. ..................... 438/624 |
|---|---|---|
| 5,744,376 A | 4/1998 | Chan et al. .................. 437/190 |
| 5,814,557 A | 9/1998 | Venkatraman et al. ...... 438/622 |
| 5,882,399 A | 3/1999 | Ngan et al. ................... 117/89 |
| 5,889,328 A | 3/1999 | Joshi et al. .................. 257/751 |
| 5,893,752 A | 4/1999 | Zhang et al. ................ 438/687 |
| 5,985,759 A * | 11/1999 | Kim et al. ................... 438/627 |
| 6,136,707 A * | 10/2000 | Cohen .......................... 438/687 |
| 6,139,699 A * | 10/2000 | Chiang et al. .......... 204/192.15 |
| 6,140,241 A * | 10/2000 | Shue et al. .................. 438/687 |
| 6,177,350 B1 * | 1/2001 | Sundarrajan et al. ........ 438/637 |
| 6,271,122 B1 * | 8/2001 | Wieczorek et al. .......... 438/627 |
| 6,271,592 B1 * | 8/2001 | Kim et al. ................... 257/751 |

* cited by examiner

Primary Examiner—John F. Niebling
Assistant Examiner—Lynn Gurley
(74) Attorney, Agent, or Firm—George O. Saile; Stephen B. Ackerman; Sevgin Oktay

(57) ABSTRACT

A method is disclosed to improve copper barrier and adhesion properties of copper interconnections in integrated circuits. It is shown that combining ion metal plasma (IMP) deposition along with in-situ chemical vapor deposition (CVD) of barrier and adhesion materials provides the desired adhesion of and barrier to diffusion of copper in damascene structures. IMP deposition is performed with tantalum or tantalum nitride while CVD deposition is performed with a binary or a ternary compound from a group consisting of titanium nitride, tungsten nitride, tungsten silicon nitride, tantalum silicon nitride, titanium silicon nitride. IMP deposition provides good adhesion of copper to insulator materials, while CVD deposition provides good sidewall coverage in a copper filled trench and a copper seed layer provides good adhesion of bulk copper to adhesion/barrier layer. The IMP/CVD deposited adhesion/barrier layer is thin, thus providing low via resistance.

11 Claims, 3 Drawing Sheets

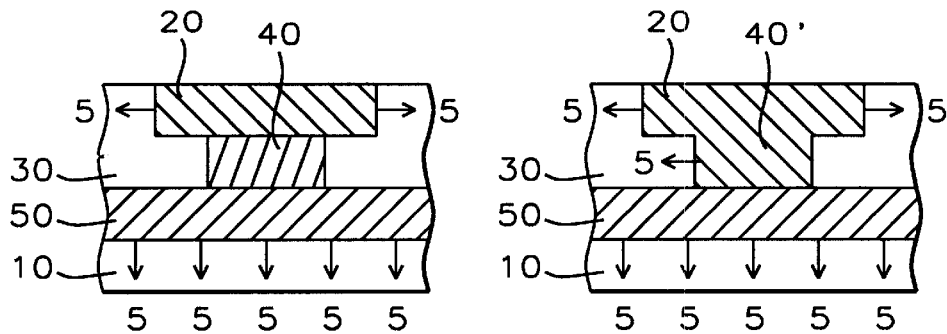
FIG. 1a – Prior Art
FIG. 1b – Prior Art
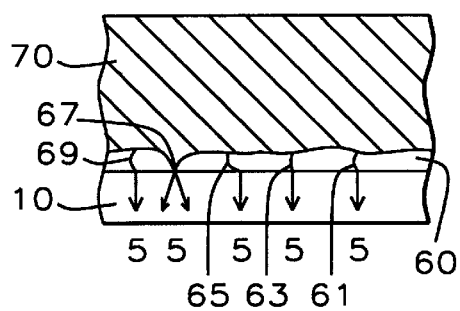
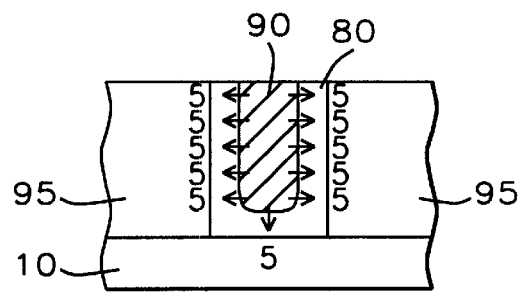
FIG. 1c – Prior Art
FIG. 1d – Prior Art
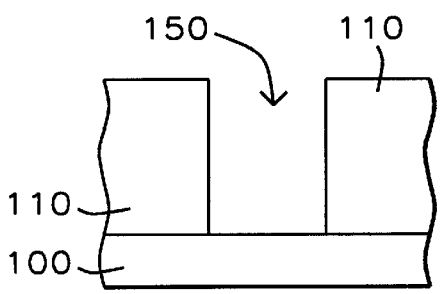
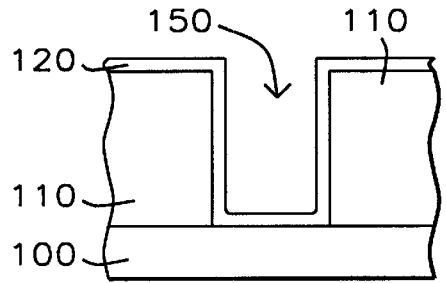
FIG. 2a
FIG. 2b

METHOD TO IMPROVE COPPER BARRIER PROPERTIES

BACKGROUND OF THE INVENTION

(1) Field of the Invention

The present invention relates to the manufacture of integrated circuits in general, and in particular, to the design and use of copper interconnections with barrier and adhesion improvements therein.

(2) Description of the Related Art

As the material of choice shifts more and more to copper for forming interconnections in integrated circuits, the relatively poor adhesion of copper to surf aces in general, and its diffusion into other materials, such as silicon, specifically, pose significant reliability problems. An improved method of forming copper interconnections overcoming these problems is disclosed later in the embodiments of the present invention.

Aluminum alloys are the most commonly used conductive materials. However, with the advent of very and ultra large scale integrated (VLSI and ULSI) circuits, the device dimensions have been continually shrinking. Thus, it has become more and more important that the metal conductors that form the interconnections between devices as well as between circuits in a semiconductor have low resistivities for faster signal propagation. Copper is often preferred for its low resistivity— about 40% less than that of aluminum— as well as for resistance to electromigration and stress voiding properties. Unfortunately, however, copper suffers from high diffusivity in common insulating materials such as silicon oxide, and oxygen-containing polymers. This can cause corrosion of the copper with the attendant serious problems of loss of adhesion, delamination, voids, and ultimately a catastrophic failure of the circuitry. A copper diffusion barrier is therefore often required.

Conventionally, the various metal interconnect layers in a semiconductor substrate are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate. It will be observed that patterning, that is, photolithography and etching of metal layers to form the needed interconnects constitute a significant portion of the process steps of manufacturing semiconductor substrates, and it is known that both photolithography and etching are complicated processes. It is desirable, therefore, to minimize such process steps, and a process known as dual damascene, provides such an approach. The term 'damascene' is derived from a form of inlaid metal jewelry first seen in the city of Damascus. In the context of integrated circuits it implies a patterned layer imbedded on and in another layer such that the top surfaces of the two layers are coplanar.

In a single damascene process, shown in FIG. 1a, grooves (20) are formed in an insulating layer (30) and filled with metal to form conductive lines. Reference numeral (40) in FIG. 1a refers to a plug that had been formed at a previous step to provide the connection to the lower level metal line (50) on substrate (10). Dual damascene (FIG. 1b) takes the process one step further in that, in addition to forming the groove (20) of a single damascene, the conductive hole opening (40') is also formed in the insulating layer. The resulting composite structure of groove and hole are filled with metal simultaneously. The process is repeated as many times as required to form the multi-level interconnections between metal lines and the holes formed in between. Contact holes are formed directly over the substrate where the metal in the hole contacts the surface of the substrate, while the via holes are formed between metal layers. With copper as the conductive metal in groove (20) and/or opening (40'), copper diffuses (shown with arrows (5) in the same Figures) into the surrounding dielectric material (30), causing electrical shorts with other neighboring lines (not shown), or into the underlying silicon (10), causing transistor poisoning where junction leakage occurs with reduced channel mobility in the transistor, thereby destroying the device.

In prior art, methods have been devised to prevent copper diffusion by employing a barrier between the copper interconnect and adjacent materials of the semiconductor device. Bai, et al., in U.S. Pat. No. 5,714,418 show a cross-section of a substrate (10) as in FIG. 1c, upon which a barrier (60) and a copper layer (70) are formed. Barrier (60) comprises a material which impedes the diffusion of copper from copper layer (70) into the underlying substrate (10). However, barrier (60) is not perfect as it has micro-defects such as pinholes (67) or voids in the film, and the barrier further comprises a number of grain boundaries illustrated as (61), (63), (65) and (69). Micro-defect (67) along with grain boundaries, act as weak spots in the barrier, permitting copper from copper layer (70) to diffuse (5) through to the underlying substrate (10). As shown, within micro-defect region (67) the copper of copper layer (70) comes into direct contact with substrate (10). Substrate (10) comprises silicon and silicon dioxide, through which copper rapidly diffuses from the micro-defect in the barrier, particularly at elevated temperatures. Similarly, copper rapidly diffuses along grain boundaries of the barrier when subjected to elevate temperatures.

It is common practice that to better isolate copper layer (70) from the underlying substrate (10), the thickness of barrier (60) is increased. However, increasing the thickness of the barrier also increases the resistance of the resulting copper interconnect as illustrated in FIG. 1d. FIG. 1d shows a cross-section of a substrate (10) upon which an electrical interconnect comprising copper layer (90) and barrier (80) have been formed in a dielectric layer material (95). As shown, the thickness of barrier layer (80) is large in comparison to the thickness of copper layer (90). It is necessary for barrier (80) to be thick enough to adequately prevent diffusion (5) of copper from copper layer (90) into either dielectric material (95) or substrate (10).

Forming a thicker barrier reduces copper diffusion through micro-defect because the defects are more likely to be incorporated into the bulk of the barrier, thereby reducing diffusion paths through the defect. In addition, while a thicker barrier may still comprise grain boundaries leading from the upper to lower surface of the barrier, these boundaries are necessarily longer. Because the grain boundaries are long, it takes a longer time for copper to diffuse throughout the length of these longer grain boundaries. However, increasing the barrier thickness while maintaining the overall width of the interconnect increases the total resistance of the electrical interconnect due to the reduction in volume that the low resistance copper material can occupy. The barrier materials, such as nitrides, are invariably much more resistive than copper. The total width of the interconnect could be increased to counteract the increased resistance, but doing so would reduce the density of the integrated circuit. As a result, the speed at which the integrated circuit operates is reduced.

Thus, Bai, et al., disclose a thin diffusion barrier which permits the low resistivity of copper or other interconnect material to be exploited in an electrical interconnect. In order to achieve a thin diffusion barrier, a bi-layer diffusion barrier is formed over the substrate. The barrier comprises a capturing layer beneath a blocking layer. The blocking layer is both thicker than the capturing layer and is unreactive with the capturing layer. A conductive layer, thicker than the blocking layer, is then formed over the barrier. While the conducive layer is unreactive with the blocking layer of the barrier, the conductive layer is reactive with the capturing layer of the barrier.

Chan, et al., in U.S. Pat. No. 5,744,376 disclose a method of manufacturing copper interconnect with a top barrier layer. In this method, a damascene copper connector is formed whose upper surface is coplanar with the upper surface of the insulating layer in which it is embedded. Out-diffusion of copper from the connector is prevented by two barrier layers. One is located at the interface between the connector and the insulating layer, while the second barrier is an insulating layer which covers the upper surface of the connector. The damascene process involves filling a trench in the surface of the insulator with copper and then removing the excess by chemical-mechanical polishing. Since the photoresist is never in direct contact with the copper the problem of copper oxidation during resist ashing has been effectively eliminated.

Another method of forming a barrier layer is disclosed by Ngan, et al., in U.S. Pat. No. 5,882,399 which enables a consistently highly oriented crystalline structure in a metallic interconnect. In order to ensure the consistent crystal orientation content of the barrier layer structure, the first layer of the barrier layer structure is formed to have a minimal thickness of at least 150 Å to compensate for irregularities in the crystal orientation which may be present during the initial deposition of this layer.

Joshi, et al., of U.S. Pat. 5,889,328 teach the forming of refractory metal capped low resistivity metal conductor lines and vias which are not scratched, corroded, or smeared during chemical-mechanical polishing. Zhang, et al., on the other hand, use a conductive film comprising refractory metal and nitrogen in a first portion that lies closer to the substrate and a second portion that lies further from the substrate. The nitrogen percentage for the second portion is lower than the nitrogen atomic percentage for the first portion. The second conductive film, underlying the first conductive film, includes mostly copper. The combination of the first and second portions within the first conductive film provides a good diffusion barrier (first portion) and has good adhesion (second portion) with the second conductive film. In another U.S. Pat. No. 5,814,557, Venkatraman, et al., a barrier layer is used to serve as a seed layer to prevent the out diffusion of copper in a damascene structure.

It is disclosed later in the embodiments of the present invention a method of combining an ion metal plasma (IMP) deposition method with chemical vapor deposition (CVD) of ternary compounds, whereby a thin barrier layer is formed between copper and surrounding materials to promote copper adhesion, while discouraging copper diffusion in integrated circuit interconnects.

SUMMARY OF THE INVENTION

It is therefore an object of the present invention to provide a method of forming a damascene copper interconnect in an integrated circuit.

It is another object of the present invention to provide a method of improving the adhesion of copper to the surrounding material in a damascene interconnect.

It is yet another object of the present invention to provide a method of reducing copper diffusion to the surrounding material in a damascene interconnect.

It is still another object of this invention to provide a method of forming a copper interconnect by combining ion metal plasma (IMP) deposition method with PVD/CVD deposition method.

These objects are accomplished by providing a semiconductor substrate having a substructure comprising devices formed in said substrate and a metal layer formed thereon; forming an inter level dielectric (ILD) layer over said substrate; patterning and etching said ILD layer to form a trench with inside walls therein; performing in-situ PVD/CVD deposition of a diffusion barrier layer along with ion metal plasma (IMP) deposition of an adhesion layer to form a combined (adhesion+barrier) layer on said substrate including inside walls of said trench; forming a metal seed layer over said substrate including over said (adhesion+barrier) layer; forming a metal layer over said substrate including over said metal seed layer; and removing excess metal layer from said substrate.

BRIEF DESCRIPTION OF THE DRAWINGS

In the drawings that follow, similar numerals are used referring to similar parts throughout the several views.

FIG. 1a is a cross-sectional view of a portion of a semiconductor substrate showing the forming of a single inlaid damascene metal over a plug formed on a lower metal layer, according to prior art.

FIG. 1b is a cross-sectional view of a portion of a semiconductor substrate showing the forming of a dual damascene over a metal layer, according to prior art.

FIG. 1c is a cross-sectional view of a portion of a copper layer over a semiconductor substrate with an intervening thin diffusion barrier layer showing the diffusion of copper from the copper layer to the substrate through defects such as pinholes, cracks and grain boundaries, according to prior art.

FIG. 1d is a cross-sectional view of a portion of a copper interconnect in a semiconductor substrate showing a thick barrier in the interconnect to prevent copper diffusion into surrounding materials, according to prior art.

FIG. 2a is a cross-sectional view of a portion of a semiconductor substrate showing the forming of a single damascene structure, according to the present invention.

FIG. 2b is a cross-sectional view of a portion of a semiconductor substrate showing the forming of an adhesion layer, according to the present invention.

DESCRIPTION OF THE PREFERRED EMBODIMENTS

Figures 2C, 2D:
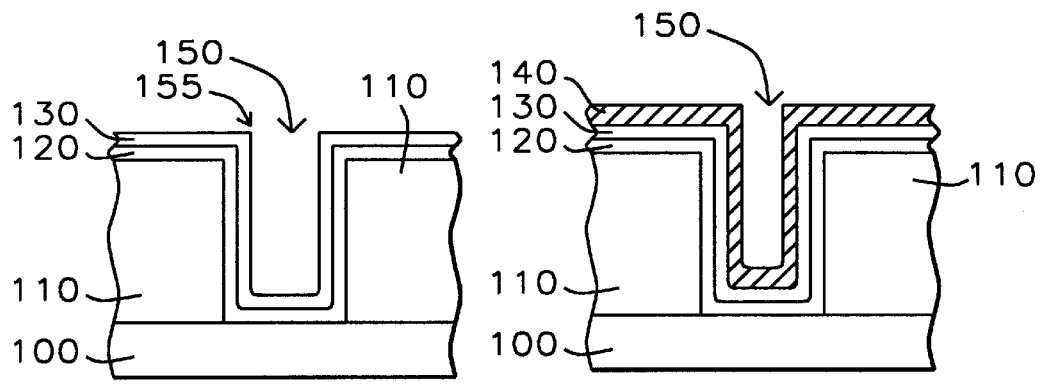
FIG. 2c is a cross-sectional view of a portion of a semiconductor substrate showing both the adhesion and the diffusion barrier layer, according to the present invention.
FIG. 2d is a cross-sectional view of a portion of a semiconductor substrate showing the forming of a copper seed layer over the adhesion and the diffusion barrier layers of FIG. 2c, according to the present invention.

Referring now to the drawings, in particular to FIGS. 2a–2f, there is shown a method to improve copper barrier and adhesion properties of copper interconnections in integrated circuits. In a first embodiment, the adhesion and barrier layers are formed sequentially using ion metal plasma (IMP) first, followed by physical vapor deposition (PVD) or chemical vapor deposition (CVD), respectively. Tantalum or tantalum nitride is used for ion metal deposition and binary or ternary compounds such as titanium nitride, tungsten nitride, tantalum silicon nitride, titanium silicon nitride for PVD/CVD. In a second embodiment, IMP and PVD/CVD are combined to be performed simultaneously insitu. It is disclosed that PVD/CVD results in good step coverage of diffusion barrier layer on all walls of a damascene trench, or, groove, while IMP yields good adhesion and low via resistance.

More specifically, FIG. 2a shows a substrate (100) upon which a single damascene trench (150) has been formed, for purposes of illustration of the invention. It will be appreciated by those skilled in the art that the following steps can be applied equally well to a dual damascene structure.

Trench (150) is formed in an inter-level dielectric (ILD) layer (110) by using conventional etching techniques. Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, the blanket dielectric layer (110) is preferably formed of a dielectric material chosen from the group of dielectric materials consisting of silicon oxide dielectric materials, silicon nitride, silicon oxynitride, or a polyimide. Preferably, the blanket dielectric layer (110) has a thickness between about 5000 to 12000 Å. Correspondingly, trench (150) has a depth between about 5000 to 12000 Å, which is obtained by using an etch recipe comprising gases $CH_4$/ $CHF_3$/Ar.

Next, a copper adhesion layer (120) is formed on the substrate including the inside walls of trench (150) by using ion metal plasma (IMP) method, as shown in FIG. 2b. IMP deposition refers to ion-deposition sputtering wherein a reactive gas is supplied during the sputtering to react with the ionized material being sputtered, producing an ion-deposition sputtered compound containing the reactive gas element. It is critical that the sputtered material is either tantalum (Ta) or tantalum nitride (TaN), and that the reactive gas is $N_2$ at a pressure between about 10 to 50 mTorr, temperature between about 20 to 300° C., and rf power between about 0.5 to 2 kW. It has been found that IMP-Ta or IMP-TaN provides good adhesion and low via resistance with a thickness between about 50 to 300 Å.

Barrier layer (130) is next deposited over adhesion layer (120) using PVD or CVD methods as shown in FIG. 2c. It is important that this protective material be selected from a group of materials compatible with copper, that is, materials that will form a barrier to diffusion of copper into the dielectric layers surrounding the damascene structure. The barrier material is selected from a group consisting of titanium nitride, tungsten nitride, tungsten silicon nitride, tantalum silicon nitride, titanium silicon nitride or other ternary compounds and the deposition is performed in an environment where the pressure is between about 1 to 10000 mtorr, and temperature between about 20 to 450° C. It is preferred that diffusion barrier layer (130) has a thickness between about 50 to 300 Å.

Figures 2E, 2F:
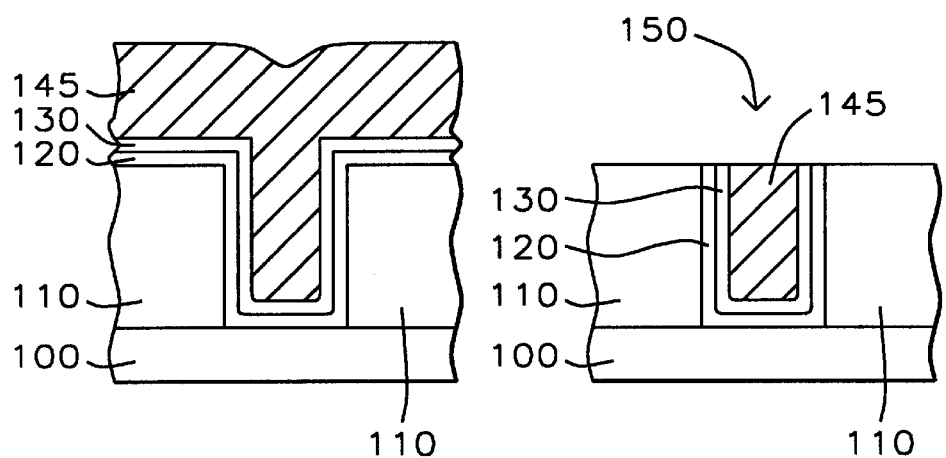
FIG. 2e is a cross-sectional view of a portion of a semiconductor substrate showing the forming of a metal layer over the substrate, including the trench of this invention.
FIG. 2f is a cross-sectional view of a portion of a semiconductor substrate showing the removal of the excess metal of FIG. 2e by chemical-mechanical polishing.

The barrier lined trench (150) of FIG. 2c is next lined with still another copper seed layer (140) shown in FIG. 2d. This layer can be deposited using either IMP or PVD/CVD techniques to a thickness between about 500 to 2000 Å. Trench (150) is next over-filled with a conductive metal in general, but preferably with copper (145) of this invention, as shown in FIG. 2e. This is accomplished by using electro-chemical deposition (ECD) method. It will be noted that seed layer (140) becomes a part of the bulk copper layer (145). Copper is then planarized by using the well known chemical mechanical polishing technique as shown in FIG. 2f.

In a second embodiment of the present invention, even better adhesion and lower via resistance of the damascene copper interconnect is obtained through combining the ion metal plasma (IMP) deposition with PVD/CVD deposition of the barrier layer in trench (150) shown in FIG. 2a. In addition, the step coverage (155) over the edge of the opening of the trench shown in FIG. 2c is much improved with the combined IMP/PVD/CVD process. As is known in the art, when thin films are deposited over steps or edges in a substrate, the film thickness over the step is sometimes much less than the nominal thickness elsewhere on the substrate. This thinning over the steps can cause cracks or breakage, which is not desirable. With IMP sputtering, the step coverage can be increased effectively.

Thus, as a main feature and key aspect of the invention, tantalum (Ta) or tantalum nitride (TaN) is deposited on the substrate, including the inside walls of trench (150), using IMP deposition method while simultaneously depositing a binary or ternary compound using PVD or CVD technique. (FIG. 2c). It is critical that a binary, or a ternary compound is selected from a group consisting of titanium nitride, tungsten nitride, tungsten silicon nitride, tantalum silicon nitride, titanium silicon nitride. Preferably, the combined IMP/PVD or IMP/CVD process is performed at a pressure between about 1 to 10000 mtorr, temperature between about 20 to 450° C., with energy between about 0.5 to 2 kilowatts (KW), and that the resulting (barrier+adhesion) liner has a thickness between about 50 to 300 Å.

Figure 2G:
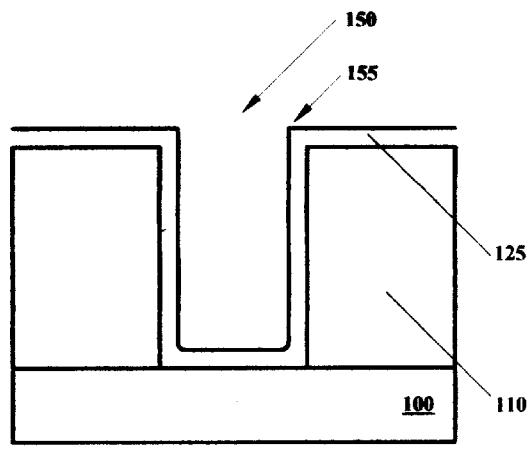
FIG. 2g is a cross-sectional view of a portion of a semiconductor substrate showing the combined (adhesion+ barrier) layer of the IMP/PVD or /CVD process, according to the present invention.
Figure 2H:
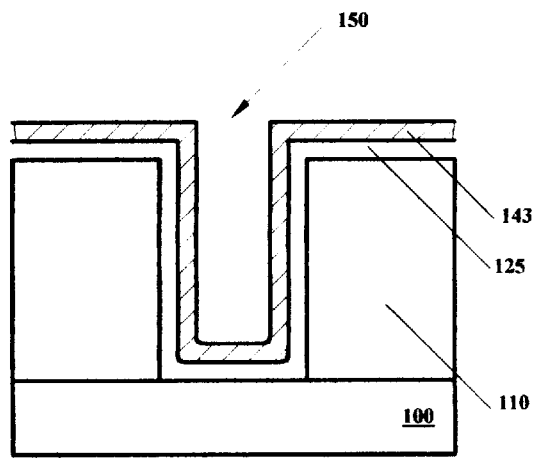
FIG. 2h is a cross-sectional view of a portion of a semiconductor substrate showing the forming of a copper seed layer over the (adhesion+barrier) layer of FIG. 2g, according to the present invention.
Figure 2I:
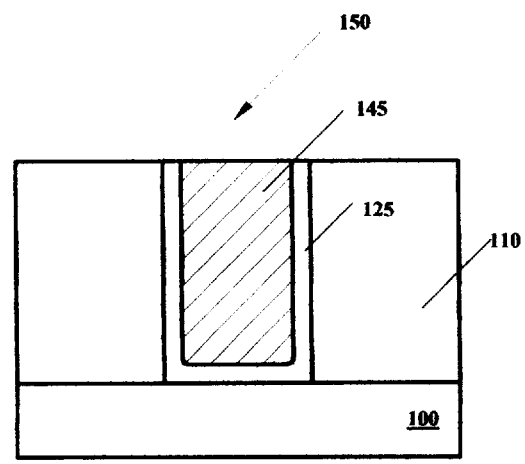
FIG. 2i is a cross-sectional view of a portion of a semiconductor substrate showing the forming of a metal interconnect, according to the present invention.

This (barrier+adhesion) liner of the second embodiment is shown as one layer (125) in FIG. 2g. Trench (150) of FIG. 2g is next lined with still another copper seed layer (143)

shown in FIG. 2h. This layer can be deposited using either IMP or PVD/CVD techniques to a thickness between about 500 to 2000 Å. Trench (150) is next over-filled with a conductive metal in general, but preferably with copper of this invention. This is accomplished by using electrochemical deposition (ECD) method. Copper is then planarized by using the well known chemical mechanical polishing technique. The resulting structure is shown in FIG. 2i, where it will be noted that seed layer (143) becomes a part of the bulk copper layer (145).

Though copper is preferred for the embodiments of the present invention, it will be obvious, however, to those skilled in the art that other metals, such as tungsten (W), or a silicide can also be used for the interconnect.

Though these numerous details of the disclosed method are set forth here, such as process parameters and materials to be used, to provide an understanding of the present invention, it will be obvious, however, to those skilled in the art that these specific details need not be employed to practice the present invention. At the same time, it will be evident that the same methods may be employed in other similar process steps that are too many to cite. For example, as there are different types of damascene processes, it will be apparent to those skilled in the art that the two embodiments depicted in the drawings and disclosed in this invention will be applicable to any damascene process. Furthermore, other materials, such as tungsten (W) and suicides, may also be used in damascene interconnects.

That is to say, while the invention has been particularly shown and described with reference to the preferred embodiments thereof, it will be understood by those skilled in the art that various changes in form and details may be made without departing from the spirit and scope of the invention.

What is claimed is:

1. A method to improve copper barrier properties comprising the steps of:
   providing a semiconductor substrate having a substructure comprising devices formed in said substrate and a metal layer formed thereon;
   forming an inter level dielectric (ILD) layer over said substrate;
   patterning and etching said ILD layer to form a trench with inside walls therein;
   performing in-situ PVD/CVD deposition of a diffusion barrier layer along with ion metal plasma (IMP) deposition of an adhesion layer to form a combined (adhesion+barrier) layer on said substrate including inside walls of said trench;
   forming a metal seed layer over said substrate including over said (adhesion+barrier) layer;
   forming a second metal layer over said substrate including over said metal seed layer; and
   removing any excess second metal layer from said substrate.

2. The method of claim 1, wherein said substrate is silicon.

3. The method of claim 1, wherein said ILD layer comprises an oxide or a polyimide.

4. The method of claim 1, wherein said ILD layer has a thickness between about 5000 to 12000 Å.

5. The method of claim 1, wherein said trench has a depth between about 5000 to 12000 Å.

6. The method of claim 1, wherein said in-situ PVD/CVD deposition of a diffusion barrier layer along with ion metal plasma (IMP) deposition of an adhesion layer to form a combined (adhesion+barrier) layer is accomplished with material taken from the group consisting of titanium nitride, tungsten nitride, tungsten silicon nitride, tantalum silicon nitride, titanium silicon nitride or other ternary compound at a pressure between about 1 to 10000 mtorr, temperature between about 20 to 450° C., with energy between about 0.5 to 2 KW.

7. The method of claim 1, wherein said (adhesion+diffusion) layer has a thickness between about 50 to 300 Å.

8. The method of claim 1, wherein said forming a metal seed layer is accomplished by IMP deposition of copper or by CVD deposition of copper.

9. The method of claim 1, wherein said metal seed layer has a thickness between about 500 to 2000 Å.

10. The method of claim 1, wherein said forming a second metal layer is accomplished by depositing copper.

11. The method of claim 1, wherein said removing said excess second metal is accomplished by chemical-mechanical polishing.

* * * * *